United States Patent [19]

Ishino et al.

[11] Patent Number: 4,474,676
[45] Date of Patent: Oct. 2, 1984

[54] ELECTROMAGNETIC INTERFERENCE SHIELDING MATERIAL

[75] Inventors: Ken Ishino; Yasuo Hashimoto; Yoshikazu Narumiya, all of Tokyo, Japan

[73] Assignee: TDK Corporation, Tokyo, Japan

[21] Appl. No.: 522,580

[22] Filed: Aug. 12, 1983

[30] Foreign Application Priority Data

Feb. 28, 1983 [JP] Japan .................................. 58-31007

[51] Int. Cl.$^3$ ........................ C04B 35/04; H01F 1/00; H01F 1/26
[52] U.S. Cl. .............................. 252/62.54; 252/62.53; 174/35 R
[58] Field of Search .................. 252/62.54, 62.53; 174/35 R

[56] References Cited

U.S. PATENT DOCUMENTS

| | | | |
|---|---|---|---|
| 2,283,925 | 5/1942 | Harvey | 252/62.54 |
| 3,668,176 | 6/1972 | Childress | 252/62.54 |
| 3,800,158 | 3/1974 | Grosbard | 174/35 R |
| 4,308,155 | 12/1981 | Tada | 252/62.54 |
| 4,331,285 | 5/1982 | Gottwals | 174/35 R |
| 4,431,979 | 2/1984 | Stijntjes et al. | 252/62.54 |

OTHER PUBLICATIONS

Chem. Abstracts; vol. 95; Mitsubishi Abstract No. 63439.

*Primary Examiner*—Arthur P. Demers
*Attorney, Agent, or Firm*—Armstrong, Nikaido, Marmelstein & Kubovcik

[57] ABSTRACT

The present invention relates to an electromagnetic interference shielding material used for shielding radios and the like from electromagnetic waves emitted from a computer or the like. In the prior art, a zinc flame-sprayed shielding material is applied on the housing of a computer or the like to shield it from electromagnetic waves.

The present invention provides an electromagnetic interference shielding material having an improved durability and shield effectiveness (SE) and comprising a ferromagnetic amorphous alloy having a conductivity of $10^2 \Omega^{-1} \cdot cm^{-1}$ or more and a permeability of 100 or more at 1 kHz.

5 Claims, 4 Drawing Figures

ELECTROMAGNETIC INTERFERENCE SHIELDING MATERIAL

FIELD OF THE INVENTION

The present invention relates to electromagnetic interference shielding material used for electronic devices. The electronic devices herein include various devices, such as computers, electronic game machines, televisions, video tape recorders, computerized cash registers, switching power sources, and word processors. Especially, since a number of integrated circuits and large-scale integration circuits are used in a high-performance and high-memory capacity computer, high-frequency pulses are generated therein and exert a marked influence on a television, a radio, or other devices located near the computer. The influence of an electronic device upon a device located near the electronic device is referred to as electromagnetic interference (EMI).

DESCRIPTION OF THE PRIOR ART

A prior art method for preventing EMI is described with regard to an electronic device, i.e., a computer. Since a conventional computer is large-sized and is produced on a small scale, the computer housing is made by working a metal sheet, and no EMI occurs since the housing shields a device located near the computer from high-frequency pulses.

Recently, however, computers are much smaller in size and are being mass produced. Therefore, instead of forming the housing by working a metal sheet, plastic material is used as a housing. However, since the plastic material is permeable to electromagnetic waves which cause EMI, it is necessary to provide electromagnetic interference shielding material on the plastic material housing so as to provide a shield for a device located near a small-sized computer.

Conventionally, two methods have been used to produce electromagnetic interference shielding materials. In one method, an electroconductive layer is formed on the inner surface of a shaped body, such as a housing. In the other method, an electroconductive filler is incorporated into a shaped body, such as a housing, at the inside thereof. The first method is presently being used industrially.

Roughly ninety percent of the electromagnetic interference shielding material on the market is produced by means of a zinc flame-spraying method and a conductive-paint application method. However, these methods are expensive. In addition, an electromagnetic interference shielding material produced by means of the zinc flame-spraying method involves a problem of durability since the adhesion property of the electroconductive film formed on the plastic material body deteriorates over a long period of use and since the electroconductive film may peel off of the plastic material body, resulting in emission of electromagnetic waves from the computer.

The shield effectiveness (SE) in dB is expressed by the following equations:

$$SE = 20 \log(Ei/Et)$$

$$SE = 10 \log(Pi/Pt),$$

wherein E is the field strength in V/m, P is the field strength in W/m$^2$, i is the incident wave field, and t is the conduction field.

The electromagnetic shield characteristic (S) is expressed by $S\alpha\sqrt{\sigma^a \cdot \mu^b}$, wherein $\sigma$ is the conductivity, $\mu$ is the permeability, and a and b are constants.

The present inventors investigated electromagnetic interference shielding material in which ferrite, carbon, metal powder, and metal fibers had been incorporated into the paint therein as an electroconductive filler.

It was found that the ferrite had a somewhat high conductivity but a low permeability. Therefore, when a ferrite filler is used, the electromagnetic shield characteristic (S) is not excellent. The carbon, metal powder, and mtal fibers were paramagnetic and thus the permeability $\mu$ thereof was equal to 1. Therefore, they are only effective for shielding the electric field.

SUMMARY OF THE INVENTION

It is an object of the present invention to provide an electromagnetic interference shielding material having a high shield effectiveness (SE), especially when it is used to shield an electronic device from electromagnetic waves of from MHz to GHz, and a stable durability when used for various electronic devices.

In accordance with the present invention, there is provided an electromagnetic shield material, characterized in that a ferromagnetic amorphous alloy having a conductivity of $10^2 \Omega^{-1} \cdot cm^{-1}$ or more and a permeability of 100 or more at 1 kHz is incorporated into a polymeric organic substance in the form of short pieces, short fibers, flakes, or grains.

This ferromagnetic amorphous alloy having the above-specified conductivity and permeability provides a good electromagnetic shield characteristic. The forms of the ferromagnetic amorphous alloy are selected so that when the ferromagnetic amorphous alloy, in the form of, for example, short pieces, is dispersed in a polymeric organic substance, the resultant electromagnetic material has a good formability. In addition, since the ferromagnetic amorphous alloy has a selected shape, it therefore has a high aspect ratio, which high aspect ratio renders the demagnetization field in the ferromagnetic amorphous alloy very small, with the result that a high effective permeability is obtained. The demagnetization field is particulary small in a ferromagnetic amorphous alloy in the form of short pieces, short fibers, and flakes. Short fibers advantageously have a high conductivity and permeability.

DESCRIPTION OF THE PREFERRED EMBODIMENTS

The preferred embodiments of the present invention are described with reference to the drawings.

Figure 1:
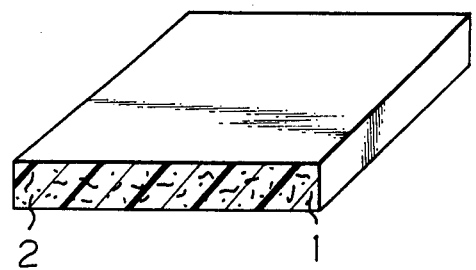
FIGS. 1 through 3 illustrate preferred embodiments of the electromagnetic interference shielding material according to the present invention.

In FIG. 1, a ferromagnetic amorphous alloy in the form of short fibers (hereinafter referred to as amorphous alloy fibers 1) is dispersed in a polymeric organic substance 2. The electromagnetic interference shielding material shown in FIG. 1 is in the form of a sheet.

Figure 2:
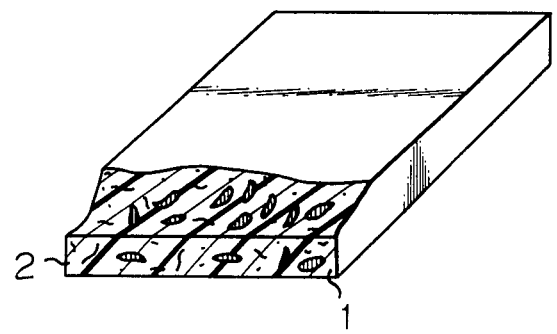

In FIG. 2, a ferromagnetic amorphous alloy in the form of flakes (hereinafter referred to as amorphous alloy flakes 3) is dispersed in the polymeric organic substance 2. The electromagnetic interference shielding material shown in FIG. 2 is also in the form of a sheet.

Although it is not shown in FIGS. 1 and 2, a ferromagnetic amorphous alloy in the form of short pieces or grains may be likewise dispersed in the polymeric organic substance 2.

The ferromagnetic amorphous alloy used according to the present invention may have any composition which can exhibit a conductivity of $10^2 \Omega^{-1} \text{ cm}^{-1}$ or more and a permeability of 100 or more at 1 kHz but is preferably composed of at least one metallic element selected from the group consisting of Fe, Ni, and Co and at least one metalloid element selected from the group consisting of Si, B, C, Cr, and Mo.

The polymeric organic substance used according to the present invention includes natural rubber, synthetic resin, polymeric resin, paint, and the like.

The volume ratio of the ferromagnetic amorphous alloy to the electromagnetic interference shielding material is preferably from 0.04:1 to 0.65:1. In addition, the short pieces, short fibers, flakes, and grains used according to the present invention preferably have an aspect ratio of from 1 to 20,000. A small aspect ratio is desirable for obtaining a high volume ratio of the ferromagnetic amorphous alloy. The short fibers usually have a length of 20 mm or less, and the length of the largest side of the flakes is usually 1 mm or less.

A method for manufacturing the electromagnetic interference shielding material is now described.

A ferromagnetic amorphous alloy in the form of short pieces, short fibers, flakes, or grains can be prepared by the rapid quenching of an alloy melt. This method concretely includes a gun method, a piston anvil method, and a torsion-catapult method, by which methods an amorphous alloy in the form of a thin sheet is usually obtained, as well as a spray method, a cavitation method, a method in which the alloy melt is ejected into liquid, and a spark method, by which methods an amorphous alloy in a powder form is usually obtained. Conventional methods may also be used to obtain an amorphous alloy in a strip of wire form. The so formed amorphous alloy strip or wire is subjected to slitting, cutting, or another type of mechanical working so as to shape it into a predetermined shape. The so-shaped amorphous alloy may be annealed at a low temperature so as to relieve the mechanical stress.

The so-called ferromagnetic amorphous alloy in the form of short pieces, short fibers, flakes, or grains is thoroughly mixed with rubber, paint, and the like. The resultant mixture is then subjected to, for example, drying or hardening at a temperature less than the crystallization temperature of the ferromagnetic amorphous alloy or to shaping to shape it in the form of a sheet, a film, or the like, thereby completing the method for manufacturing the electromagnetic interference shielding material. The thickness of the sheet or the film depends on the magnitude of the high-frequency pulses and may be from 2 to 3 mm. The mixture mentioned above may be applied on the housing of a computer and then dried. Alternatively, the electromagnetic interference shielding material in the form of a sheet may be bonded or secured to the housing of a computer by any appropriate means.

The shield effectiveness (SE) of the electromagnetic interference shielding material according to the present invention is at least 30 dB or more, preferably 40 dB or more, when the frequency of the electromagnetic waves is from 1 MHz to less than 100 MHz. This shield effectiveness (SE) is higher than that of electromagnetic interference shielding material which is mainly comprised of ferrite. The electromagnetic interference shielding material according to the present invention adheres very well to a plastic housing because the polymeric organic substance contained in the electromagnetic interference shielding material is very adhesive. The electromagnetic interference shielding material according to the present invention is corrosion resistant and thus is highly reliable as compared with zinc flame-sprayed electromagnetic interference shielding material.

The present invention is now described with reference to an Example.

An alloy melt containing 40 mole % of Fe, 38 mole % of Ni, 4 mole % of Mo, and 18 mole % of B was quenched by means of a one-roll method to obtain ferromagnetic amorphous alloy wire having a cross section of 1 mm×0.1 mm. The ferromagnetic amorphous alloy wire was cut into 10 mm-long short fibers. The short fibers had a conductivity of approximately $10^3 \Omega^{-1} \cdot \text{cm}^{-1}$ and a permeability of 50,000 at 1 kHz. The short fibers were mixed with silicone resin so that the volume of the short fibers was 50% based on the mixture. The mixture was shaped into a sheet and was dried at 25° C., and thus the electromagnetic interference shielding material according to the present invention was obtained.

Figure 3:
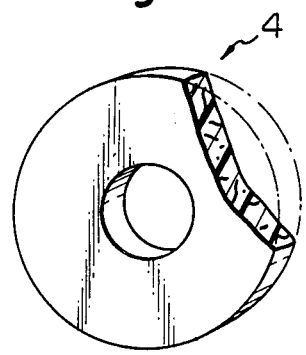

FIG. 3 shows a cylindrically shaped and dried mixture of 50 vol. % of the short fibers 5 and 50 vol. % of the silicone resin 6. The conductivity and permeability at 1 kHz of the cylindrical body were approximately $10 \Omega^{-1} \cdot \text{cm}^{-1}$ and approximately 50, respectively.

For the purpose of comparison, a paramagnetic mixture of carbon powders and silicon a resinous material having a conductivity of $10 \Omega^{-1} \cdot \text{cm}^{-1}$ was shaped into the cylindrical form shown in FIG. 3. Also, 50 vol. % of Ni-Zn ferrite and 50 vol. % of silicone resin were mixed, shaped, and dried to obtain the cylindrical body shown in FIG. 3.

Figure 4:
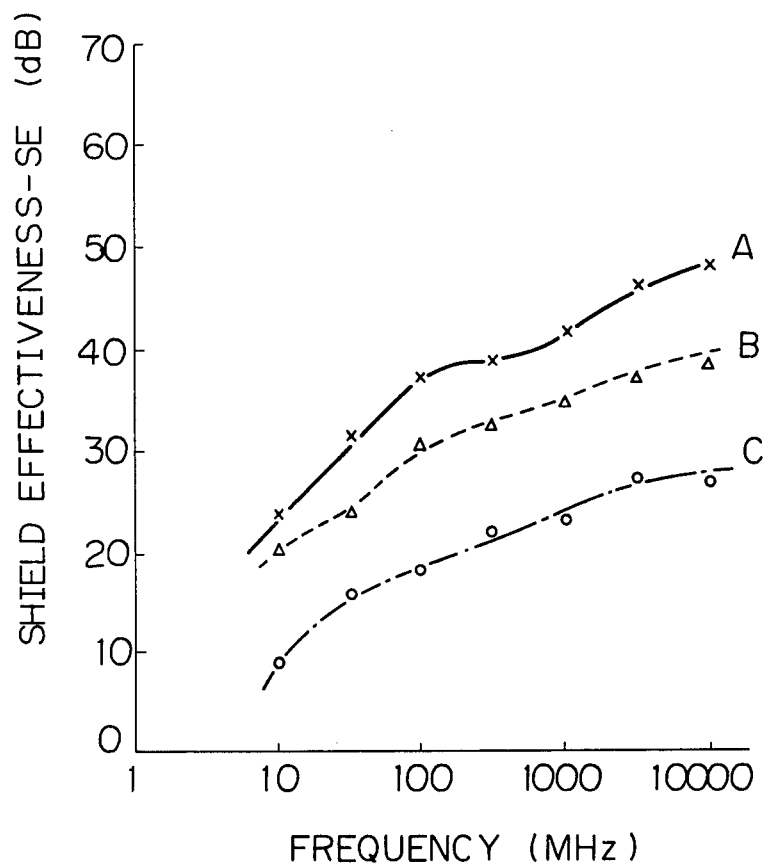
FIG. 4 is a graph showing the shield effectiveness (SE) of a 3 mm-thick electromagnetic interference shielding material according to the present invention, of a 3 mm-thick electromagnetic interference shield material made of paramagnetic carbon silicon, and of an electromagnetic interference shielding material comprising Ni-Zn ferrite and silicone resin.

The shield effectiveness (SE) of the electromagnetic interference shielding material according to the present invention, the electromagnetic interference shielding material made of paramagnetic carbon silicon, and the electromagnetic interference shielding material comprising Ni-Zn ferrite and silicone resin is indicated in FIG. 4 by A, B, and C, respectively. As is apparent from FIG. 4, the shield effectiveness (SE) of the electromagnetic interference shielding material according to the present invention (A) was higher than that of the electromagnetic interference shielding material made of paramagnetic carbon silicon (B) and the electromagnetic shielding material comprising Ni-Zn ferrite and silicone resin (C).

We claim:

1. An electromagnetic interference shielding material, characterized in that a ferromagnetic amorphous alloy having a conductivity of $10^2 \Omega^{-1} \cdot \text{cm}^{-1}$ or more and a permeability of 100 or more at 1 kHz is incorporated into a polymeric organic substance in the form of short pieces, short fibers, flakes, or grains.

2. An electromagnetic interference shielding material, characterized in that said ferromagnetic amorphous alloy has an aspect ratio of from 1 to 20,000.

3. An electromagnetic interference shielding material according to claim 1, wherein the volume ratio of said ferromagnetic amorphous alloy to electromagnetic interference shielding material is from 0.04:0.96 to 0.65:0.35.

4. An electromagnetic interference shielding material according to claim 1, wherein said ferromagnetic amorphous alloy is in the form of short fibers having a length of 20 mm or less.

5. An electromagnetic interference shielding material according to claim 1, wherein said ferromagnetic amorphous alloy is in the form of flakes, the largest side of said flakes being 1 mm or less in size.

* * * * *